United States Patent [19]

Hetherington

[11] Patent Number: 5,289,546
[45] Date of Patent: Feb. 22, 1994

[54] APPARATUS AND METHOD FOR SMOOTH AUDIO SCALING

[75] Inventor: David J. Hetherington, Austin, Tex.
[73] Assignee: International Business Machines Corporation, Armonk, N.Y.
[21] Appl. No.: 13,114
[22] Filed: Feb. 1, 1993

Related U.S. Application Data

[63] Continuation of Ser. No. 770,494, Oct. 3, 1991.
[51] Int. Cl.$^5$ ............................................. H03G 3/00
[52] U.S. Cl. .................................................. 381/104
[58] Field of Search .................... 84/665; 381/104, 109

[56] References Cited

U.S. PATENT DOCUMENTS

| | | | |
|---|---|---|---|
| 4,409,682 | 10/1983 | Mori et al. | 381/104 |
| 4,731,851 | 3/1988 | Christopher | 381/104 |
| 4,928,569 | 5/1990 | Kudo et al. | 84/665 |

FOREIGN PATENT DOCUMENTS 2052898A 6/1979 United Kingdom.
2091918A 1/1982 United Kingdom.

OTHER PUBLICATIONS

E. J. Schubert, Function Tables in Digital Control Computers, Jul. 1958, pp. 316–319.
IBM Technical Disclosure Bulletin, vol. 28, No. 3, Aug. 1985, Color Or Grey Scale Selection Circuit With Corrected D/A Converter.

*Primary Examiner*—Forester W. Isen
*Attorney, Agent, or Firm*—Jeffrey S. LaBaw; Lawrence K. Stephens

[57] ABSTRACT

Apparatus and method for scaling volume for a multimedia computer system are disclosed. A volume control algorithm, in association with the computer system hardware, increases or decreases the perceived volume over time. The increase or decrease in volume being scaled to correspond to the logarithmic nature of perceived audio transmissions. Thus, fifty percent of the maximum on a given volume scale corresponds to a human perceived half volume output.

9 Claims, 3 Drawing Sheets

APPARATUS AND METHOD FOR SMOOTH AUDIO SCALING

This is a continuation of application Ser. No. 07/770,494 filed Oct. 03, 1991.

FIELD OF THE INVENTION

This invention generally relates to improvements in audio outputs and more particularly to smooth scaling of perceived audio transmissions.

BACKGROUND OF THE INVENTION

The human perception of audio volume is distinctly logarithmic in nature. For example, a drop of one-half in the amplitude of an audio signal corresponds to a discerned decrease in volume of significantly less than one half of the original volume. Thus, it is much more convenient for applications if an audio subsystem provides a volume scale such that fifty percent of the maximum of the volume sounds like half the volume to the user. Translating the volume for smooth transitions from one volume level to a higher or lower volume level over time is an especially perplexing problem.

When increasing the volume over time, the most cost effective solution is to have a Digital Signal Processor (DSP) perform the appropriate conversion. However, most DSPs are sixteen-bit, fixed point processors that are unable to effectively perform logarithmic functions because of truncation problems due to limited precision leading to round off errors. The subject invention solves this problem by presenting a fast, non-linear, smooth, accurate scaling method using a DSP.

Other applications have been faced with translating linear values to non-linear values. One example of such a solution is found in IBM Technical Disclosure Bulletin, vol. 28, no. 3, pp. 1217-1221, entitled, "COLOR OR GREY SCALE SELECTION CIRCUIT WITH CORRECTED D/A CONVERTER." The subject TDB discloses an approximation to logarithmic brightness steps employing a linear D/A converter using a suitable correction. The correction is applied by adding an offset C to the output of a linear A/D converter voltage, and multiplying by a constant. This solution is impractical as a solution to our problem due to the inaccuracies inherent in multiplication on a sixteen bit processor.

SUMMARY OF THE INVENTION

Accordingly, it is a primary object of the present invention to provide a volume control apparatus and method for a computer system, the volume control apparatus and method, in association with the computer system hardware, being capable of increasing or decreasing the volume over time in a smooth, accurate manner. The increase or decrease in volume being scaled to correspond to the logarithmic nature of audio perceptions. Thus, fifty percent of the maximum on a given volume scale corresponds to a perceived half volume output.

These and other objects of the present invention are accomplished by providing an algorithm residing in a memory of a Digital Signal Processor (DSP). The algorithm and integer scale associated with the desired linear volume, the desired ramp rate, and the digital audio values are downloaded from a host computer via the system bus to an audio subsystem. The audio subsystem has a memory shared between the host computer and the DSP. The shared memory is used to facilitate the download processing of logic (algorithm), and integer values.

The DSP, under the control of the logic passed from the host computer determines a set of logarithmic values representative of the linear change per unit of time. These values are used as multipliers for scaling the digital values representing the audio samples into values more representative of the logarithmic nature of sensed sound. The values in turn are input to a Digital to Analog Converter (DAC) for subsequent playback to a listener.

DETAILED DESCRIPTION OF THE INVENTION

The human's logarithmic perception of audio volume presents special challenges to the designers of digital audio subsystems as discussed in *Handbook for Sound Engineers, The New Audio Cyclopedia*, Glen Ballou Editor, Howard W. Sams & Company (1987). Typically, one would like to support smooth and continuous volume shifts under the management of a user's software application interfacing to a hardware apparatus. The volume shifts or "ramps" should be continuous from the user's perspective. A ramp or scale is a continuous increase from some level of volume to another level of volume. For example on a home stereo system, one turns a knob to adjust the volume of sound that the stereo is output. In a similar fashion, multimedia applications residing on a personal computer or other processor are required to manipulate the sound output for more to less volume and from a soft volume output to a louder volume output.

Adjustments in the signals activating the hardware output of the sound are logarithmic in nature. Therefore, it is critical to scale the signals to approximate the logarithmic values as nearly as possible with integer hardware. However, having the host computer on which the application is running attempt to do the complex non-linearization of the volume scale during a rapid "ramp" is not practical. The host computer has many other tasks that require attention during typical multimedia applications. Some of these include manipulation of images on the screen, disk Inputs/Outputs (I/O), keyboard and mouse processing.

The sound processing must be done on an auxiliary processor. A likely choice for this task is to use a Digital Signal Processor (DSP) in the audio subsystem of the computer as set forth in FIG. 1. The FIGURE includes some of the Technical Information that accompanies the M-Audio Capture and Playback Adapter announced and shipped on September 18, 1990 by IBM. Our invention is an enhancement to the original audio capability that accompanied the card.

Figure 1:
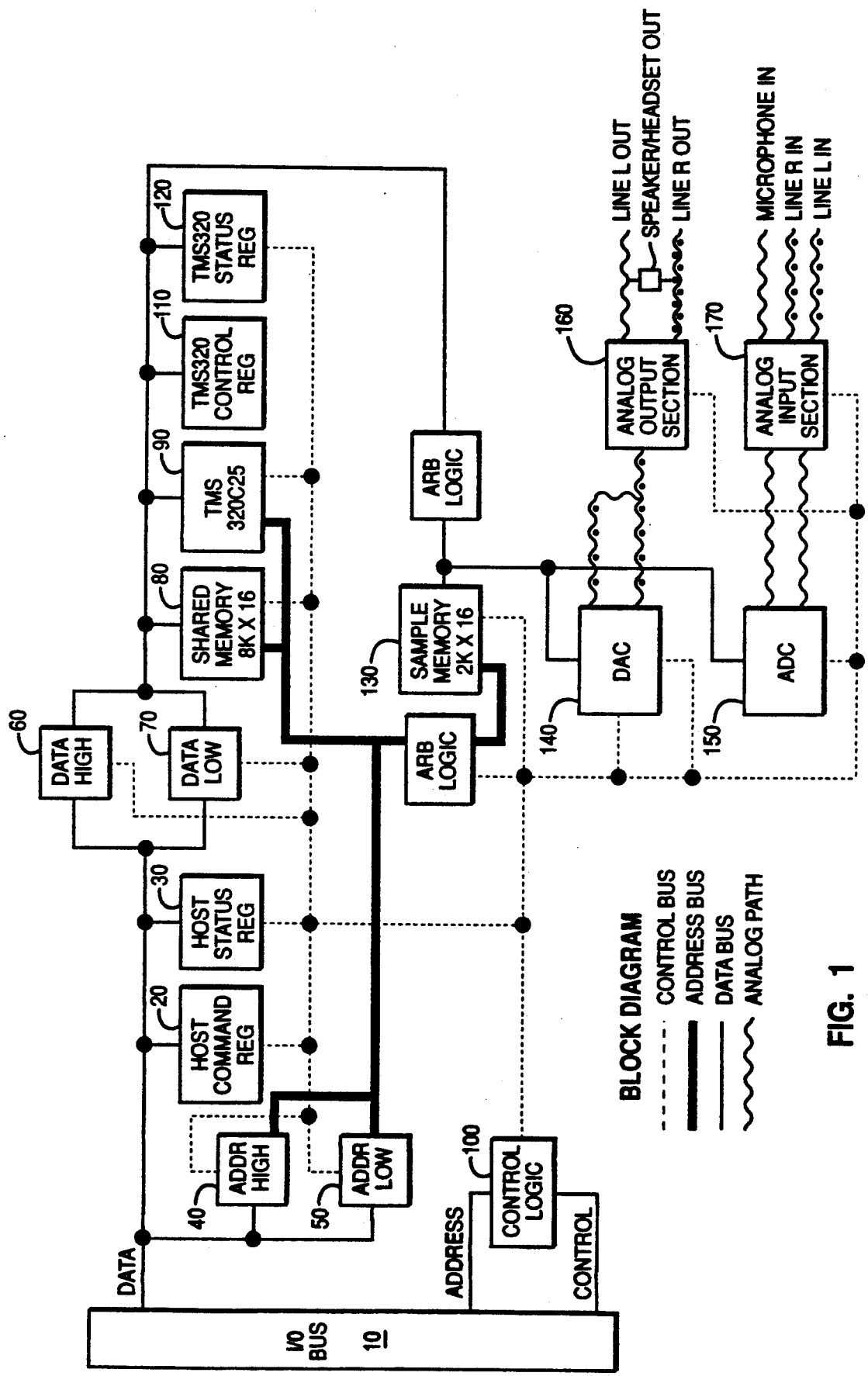
FIG. 1 is a block diagram of an audio capture and playback apparatus in accordance with the subject invention.

Referring to FIG. 1, the I/O Bus 10 is a Micro Channel or PC I/O bus which allows the audio subsystem to communicate to a PS/2 or other PC computer. Using the I/O bus, the host computer passes information to the audio subsystem employing a command register 20, status register 30, address high byte counter 40, address low byte counter 50, data high byte bidirectional latch 60, and a data low byte bidirectional latch 70.

The host command and host status registers are used by the host to issue commands and monitor the status of the audio subsystem. The address and data latches are used by the host to access the shared memory 80 which is an 8K×16 bit fast static RAM on the audio subsystem. The shared memory 80 is the means for communication between the host (personal computer / PS/2) and the Digital Signal Processor (DSP) 90. This memory is shared in the sense that both the host computer and the DSP 90 can access it.

A memory arbiter, part of the control logic 100, prevents the host and the DSP from accessing the memory at the same time. The shared memory 80 can be divided so that part of the information is logic used to control the DSP 90. The DSP 90 has its own control registers 110 and status registers 120 for issuing commands and monitoring the status of other parts of the audio subsystem.

The audio subsystem contains another block of RAM referred to as the sample memory 130. The sample memory 130 is 2K×16 bits static RAM which the DSP uses for outgoing sample signals to be played and incoming sample signals of digitized audio for transfer to the host computer for storage. The Digital to Analog Converter (DAC) 140 and the Analog to Digital Converter (ADC) 150 are interfaces between the digital world of the host computer and the audio subsystem and the analog world of sound. The DAC 140 gets digital samples from the sample memory 130, converts these samples to analog signals, and gives these signals to the analog output section 160. The analog output section 160 conditions and sends the signals to the output connectors for transmission via speakers or headsets to the ears of a listener. The DAC 140 is multiplexed to give continuous operations to both outputs.

The ADC 150 is the counterpart of the DAC 140. The ADC 150 gets analog signals from the analog input section (which received these signals from the input connectors (microphone, stereo player, mixer . . . )), converts these analog signals to digital samples, and stores them in the sample memory 130. The control logic 100 is a block of logic which among other tasks issues interrupts to the host computer after a DSP interrupt request, controls the input selection switch, and issues read, write, and enable strobes to the various latches and the Sample and Shared Memory.

For an overview of what the audio subsystem is doing, let's consider how an analog signal is sampled and stored. The host computer informs the DSP 90 through the I/O Bus 10 that the audio adapter should digitize an analog signal. The DSP 90 uses its control registers 110 to enable the ADC 150. The ADC 150 digitizes the incoming signal and places the samples in the sample memory 130. The DSP 90 gets the samples from the sample memory 130 and transfers them to the shared memory 80. The DSP 90 then informs the host computer via the I/O bus 10 that digital samples are ready for the host to read. The host gets these samples over the I/O bus 10 and stores them it the host computer RAM or disk.

Many other events are occurring behind the scenes. The control logic 100 prevents the host computer and the DSP 90 from accessing the shared memory 80 at the same time. The control logic 100 also prevents the DSP 90 and the DAC 140 from accessing the sample memory 130 at the same time, controls the sampling of the analog signal, and performs other functions. The scenario described above is a continuous operation. While the host computer is reading digital samples from the shared memory 80, the DAC 140 is putting new data in the sample memory 130, and the DSP 90 is transferring data from the sample memory 130 to the shared memory 80.

Playing back the digitized audio works in generally the same way. The host computer informs the DSP 90 that the audio subsystem should play back digitized data. In the subject invention, the host computer gets code for controlling the DSP 90 and digital audio samples from its memory or disk and transfers them to the shared memory 80 through the I/O bus 10. The DSP 90, under the control of the code, takes the samples, converts the samples to integer representations of logarithmically scaled values under the control of the code, and places them in the sample memory 130. The DSP 90 then activates the DAC 140 which converts the digitized samples into audio signals. The audio play circuitry conditions the audio signals and places them on the output connectors. The playing back is also a continuous operation.

During continuous record and playback, while the DAC 140 and ADC 150 are both operating, the DSP 90 transfers samples back and forth between sample and shared memory, and the host computer transfers samples back and forth over the I/O bus 10. Thus, the audio subsystem has the ability to play and record different sounds simultaneously. The reason that the host computer cannot access the sample memory 130 directly, rather than having the DSP 90 transfer the digitized data, is that the DSP 90 is processing the data before storing it in the sample memory 130. One aspect of the DSP processing is to convert the linear, integer representations of the sound information into logarithmically scaled, integer representation of the sound information for input to the DAC 140 for conversion into a true analog sound signal.

The audio subsystem uses a standard 16-bit, fixed-point DSP 90 for cost reasons. Typically, the DSP 90 performs a volume function under the control of the logic passed down to the shared memory 80 from the host computer as shown in the flow diagram illustrated in FIG. 2. When a host application 200 residing in the host computer 210 desires to ramp the volume up or down the application passes a sixteen bit, integer value representing a, desired linear volume 220 and an integer value representing a desired ramp rate 230 to the shared memory of the audio subsystem. The DSP 90 of FIG. 1 uses the two values as inputs to the logic already residing in the shared memory 80 of FIG. 1.

The DSP 90 under the control of the logic determines a linear change per unit of time as shown in function block 240, and calculates a current linear volume as depicted in function block 250. Then, the DSP 90 calculates a logarithmic current volume as shown in function block 270. These values are used as multipliers for the sixteen-bit signed audio samples passed to the audio subsystem at the rate of up to 88,200 samples per second from the host computer as shown in function block 287 and 280. The resultant digital value is passed to the DAC 140 for subsequent transmission to the listener at 160 of FIG. 1. Finally, a new current linear volume is calculated at function block 260 when one unit of time has elapsed as depicted in decision block 275 and steps 250, 270, 287, 280, 285, 275 and 260 are repeated for the remaining time intervals in the scale.

Figure 2:
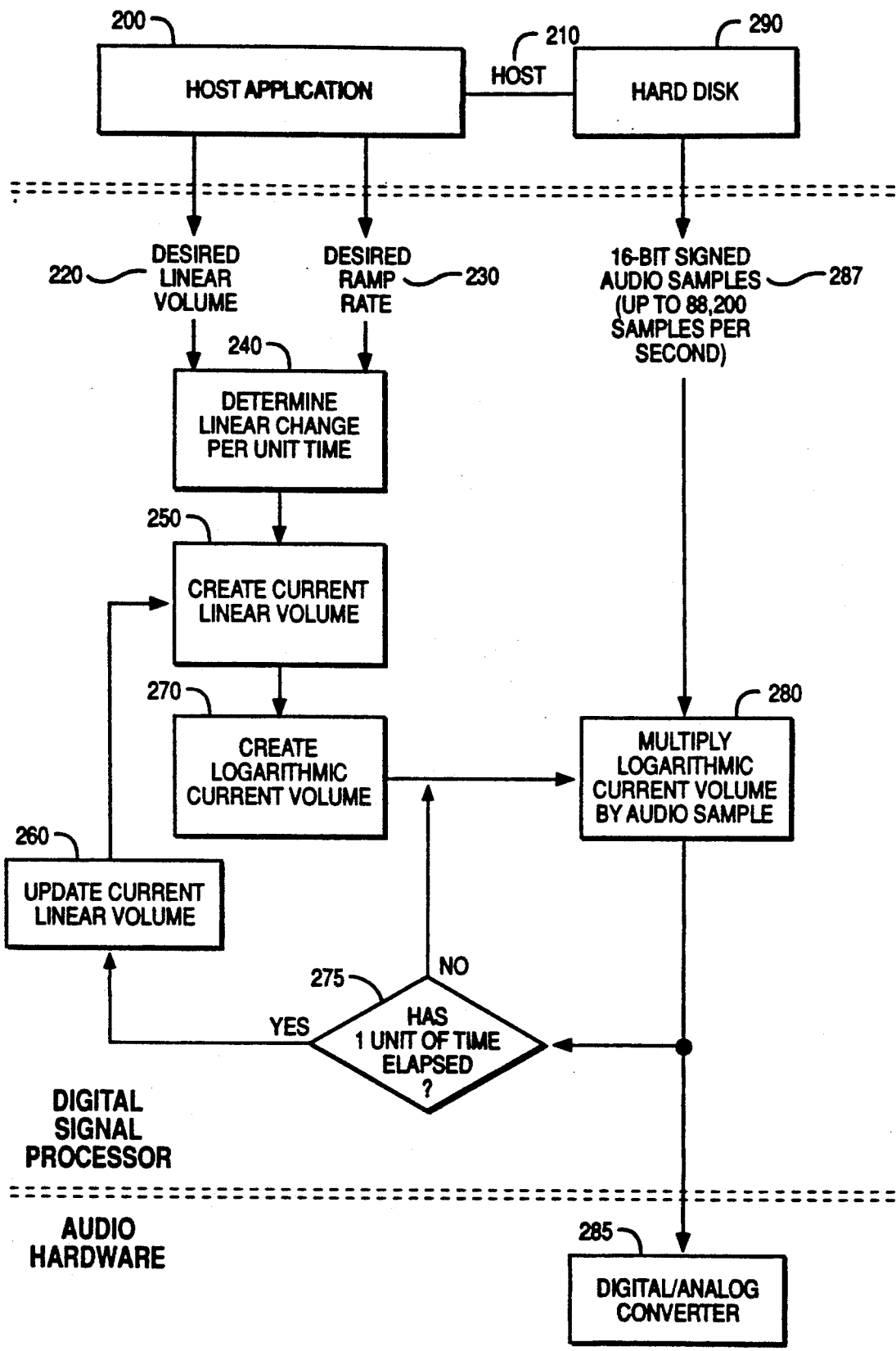
FIG. 2 is a flow diagram of the sound playback in accordance with the present invention.

A processing, problem originates in function block 270 of FIG. 2 in the step labeled "create logarithmic current volume." Typically, the function would be implemented as follows.

1. Hypothesize a mapping function of the form:

$$y(x) = e^{ax}$$

2. Decide that the sixteen-bit DSP full scale will be 100.
3. Decide that the audio samples have a range of −32,768 to 32767 and that the full scale logarithmic volume will be 32767.

This is, when we do a 16bit signed multiply on a 16-bit signal audio sample and take the 16 most significant bits of the result, a multiplier of 32767 will leave the audio unaltered. Lesser values will decrease the amplitude of the audio sample.

4. Solve for alpha (a), where $e^{a100} = 32767$. Alpha = 0.103971
5. Take the Maclaurin Series expansion of $e^{ax}$, where a=alpha. $e^{ax} = 1 + ax + 2a^2x^2/2 + a^3x^3/6 \ldots$ For a description of the Maclaurin Series and its acceptance for logarithmic functions refer to Shenk, Al; *Calculus and Analytic Geometry*, Goodyear Publishing Company (1977).
6. Truncate the Maclaurin Series to some reasonable number of terms, say 3:

$$e^{ax} = 1 + 0.103971x + 0.0054049x^2 + 0.00019732x^3$$

7. Convert the floating point constants in the range 0–1.0 fixed-point constants in the range 0–32768:
   0.103971 = = →3407
   0.0054049 = →177
   0.00018732 →6
8. Next one would attempt to implement our formula in our 16-bit engine and notice that if our range of x is 0..100, for the largest value 100, $x^3$ will exceed the 16-bit width of our register, forcing one to drop back to two terms:

$$e^{ax} = 1 + 0.103971x + 0.0054049x^2$$

9. Next, code the actual algorithm:
   a. Multiply x by x to make $x^2$.
   b. Multiply $x^2$ by 177 and retain most significant 16 bits.
   c. Multiply x by 3407 and accumulate most significant 16 bits.
   d. Add 1.

The question is whether it actually works or not. One can determine that by testing some points from 0 to 100:

TABLE 1

Test of 16-bit Fixed-Point Algorithm for Non-Linear Audio Volume Scale

| Test Value | $e^{ax}$ | Fixed-Point Algorithm |
|---|---|---|
| 0 | 1 | 1 |
| 10 | 2.8 | 2 |
| 20 | 8 | 5 |
| 30 | 22.5 | 8 |
| 40 | 63.5 | 13 |
| 50 | 179 | 19 |
| 60 | 507 | 26 |
| 70 | 1430 | 34 |
| 80 | 4037 | 43 |

TABLE 1-continued

Test of 16-bit Fixed-Point Algorithm for Non-Linear Audio Volume Scale

| Test Value | $e^{ax}$ | Fixed-Point Algorithm |
|---|---|---|
| 90 | 11397 | 53 |
| 100 | 32179 | 65 |

Clearly, truncating the Maclaurin Series after the $x^2$ term will not adequately form the exponential curve needed for the application. On the other hand, higher order equation terms will overflow the capacity of the 16-bit digital signal processor.

A closer approximation may be possible by pre-scaling all inputs by a factor of two. However, while this approach might facilitate the inclusion of an $x^3$ term in the calculation, it would diminish the accuracy of the function in the lower ranges of the scale. Power series expansions are essentially impractical in a 16-bit fixed-point processor.

Solution

The following is an example implementation of a method for effectively calculating the integer values best representing a volume changing over time.

1. Determine that 100 will be equal to full volume. The value 100 must map to the 16- bit value 32767. When this value is multiplied by our 16-bit sound sample and the most significant 16-bits of the result are taken, the sound sample will be unaltered.
2. Decide that a drop of 6 in the linear volume scale reduces the logarithmic scale by half. This choice equates conveniently to the 6 dB drop in power which corresponds to cutting the voltage of the signal by one half. Each 1 point on our linear scale will now correspond to 1 dB of power gain or loss.
3. Note that decreasing the volume by steps of 6, is possible by taking the value 32767 and shifting it right by the number of jumps of 6 volume scale steps. That is, to drop from 100 to 94 (halving the voltage) we would start with X'7FFF' (32767) and shift it right one bit to get X'3FFF' (16383). Correspondingly, to drop from 100 to 88 (quartering the voltage) we would start with X'7FFF' (32767) and shift it right two bits to get X'1FFF' (8191).
4. To construct the intervening 5 points between each drop of 6, we make 5 more masks each of which is:

$$Mask(n) = Mask(n-1)*1 / (6\_TH\ ROOT(2))$$

Figure 3:
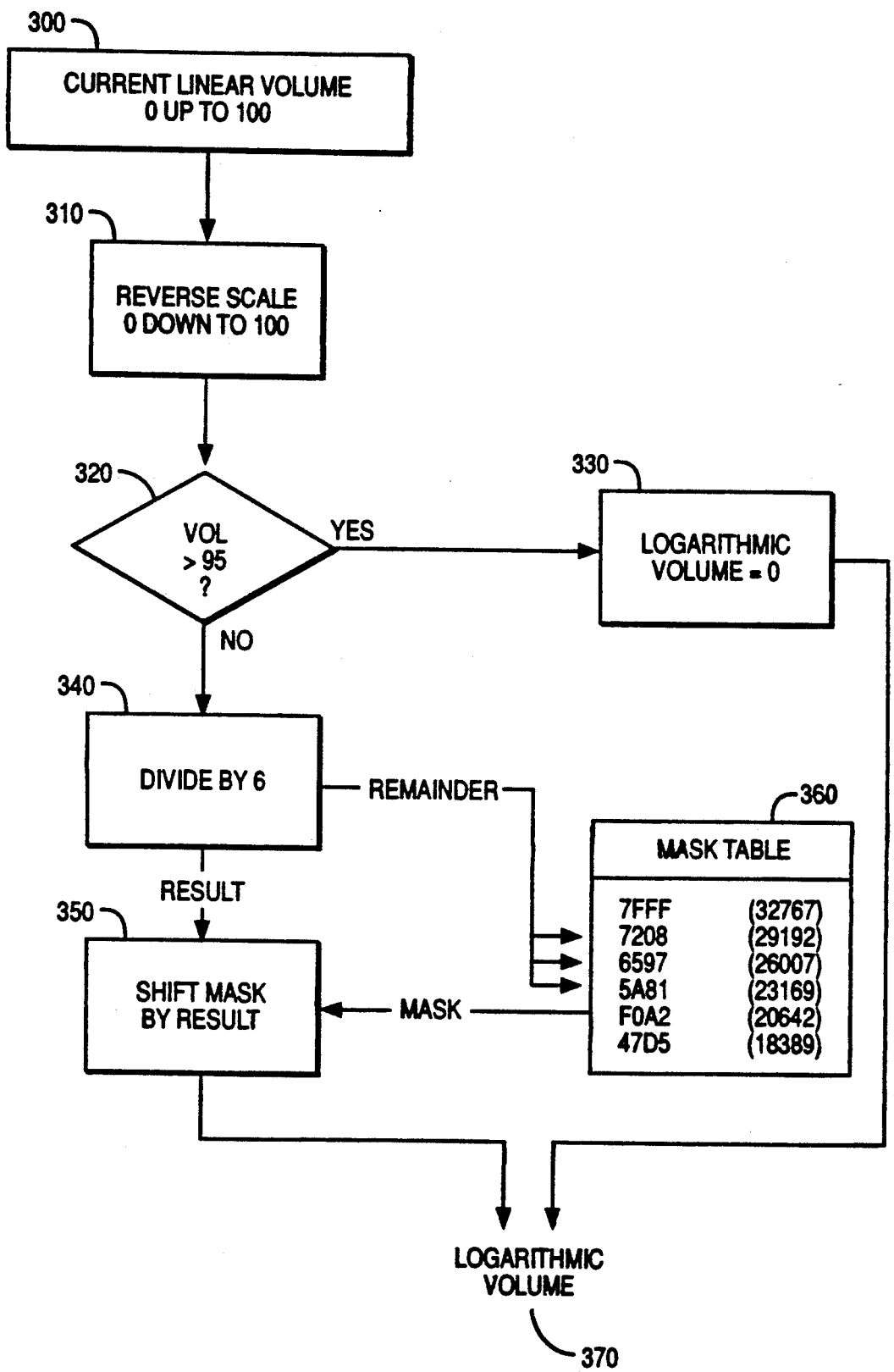
FIG. 3 is another flow diagram of the sound playback in accordance with the invention.

The actual algorithm is presented in flow diagram form in FIG. 3:

1. Take the scale 0 to 100 and reverse it. i.e.:

○ 100 becomes 0
   ○ 99 becomes 1
   ○ 98 becomes 2
   ○ and so on

2. Truncate the scale at 95.
3. Divide the truncated and reversed scale by 6.
4. Use the remainder as an index into the table of masks and select a mask:
   a. Remainder=0 selects the mask X'7FFF'.
   b. Remainder=1 selects the mask X'7FFF'/ (6*SQRT(2)).
   c. and so on.

5. Load the selected mask into a register.
6. Use the result of the division by six as the count of the number of times to shift right. If the result of the division was zero, do not shift.

Table 2 shows the results of using this method.

TABLE 2

| Test of Claimed Algorithm | |
| --- | --- |
| Test Value | Calculated value |
| 0 | 0 |
| 10 | 1 |
| 20 | 3 |
| 30 | 10 |
| 40 | 32 |
| 50 | 102 |
| 60 | 323 |
| 70 | 1023 |
| 80 | 3250 |
| 90 | 10320 |
| 100 | 32767 |

The results from this approach appear to meet our criteria. Further, the logic necessary for implementing the method only required thirty words of shared memory.

Failed Alternative Solution

Another solution which might be considered for providing a geometric volume ramping function is to use successive multiplications by a constant to produce the volume ramp down. That is, if volume is denoted by v, then:

$$v(1) = v(0) * e$$
$$v(2) = v(1) * e$$
$$v(3) = v(2) * e$$
$$\ldots$$
$$v(n) = v(n - 1) * e$$

Where v(n)=volume after n steps.

To determine if the approach works a sample set of requirements must be defined:
1. The volume scale will be a number between 0 and 32767 (X'7FFF').
2. The ramp will be very smooth to the human ear; the volume scale will be updated at least every 50 milliseconds.
3. The algorithm will generate a ramp of up to 60 seconds with accuracy within 1 second.
4. We have chosen our scale such that:
   o 100 is full volume
   o Each 1 point up or down is 1 decibel of attenuation or amplification. That is, reducing the volume by 6 reduces it 6 dB which means the volume amplitude is reduced by ½.

In a system sampling at 44,100 samples per second, a convenient time to update the volume scale is every 2048 samples or 46.4 milliseconds. This updated rate satisfies our smoothness requirements.

Suppose that we wish to ramp about half way down our non-linear scale in 60 seconds, i.e.: we ramp from 100 down to 52. This is about 48 dB ramp.
1. That is, if Vend is the ending volume and Vstart is the starting volume in dBs, then:

$$-48 = 20 * \log_{10}(V_{end}/V_{start})$$

$$2^{-8} = V_{end} / V_{start}$$

$$V_{end} = 2^{-8} * V_{start}$$

2. Updating every 46.4 milliseconds, to ramp down in 60 seconds we need 60/0.0464=1292 steps.
3. The multiplier is 32627 which is the twelve-hundred ninety-second (1292) root of $2^{-8} * 32767$.
4. The start level is 32767 (X'7FFF') and the target level is 127 (X'7FX').
5. Attached below is a REXX program for simulating the method.

```
/*** OS/2 REXX ******/ start = 32767
count = 0
actual = start
multiplier = 32627

DO WHILE actual > 127
    actual = actual * multiplier
    actual = TRUNC(actual / 32768)
    count = count + 1
END SAY ' count = ' count
SAY ' actual = ' actual
```

6. The count shows that the target is reached in 1155 steps or 53.6 seconds, an unacceptably large error.

What is we use the method described previously to meet the same requirements?
1. We start with a volume multiplier of 32767. This will be used to modify the linear volume scale which starts at 100. i.e.:

$$v(0) = 32767 \times 100/32768$$

$$v(0) = 100$$

2. Our target volume multiplier is:

$$32767 \times (52/100) = 17039$$

That is:

$$v(n) = 17039 \times 100/32768$$
$$= 52$$

3. Our step size is:
   (32767−17039)/1292=12.17 which we truncate to 12.
4. Using the truncated step size of 12, the ramp completes in:
   (32767−17039)/12=1311 steps, which equals 60.83 seconds, thus meeting our accuracy target.

Essentially, the approach of successive multiplications cannot be implemented with sufficient accuracy on a 16-bit fixed point digital signal processor. The truncation error in the multiplier grows geometrically leading to unacceptable timing accuracy. The truncation error in our solution grows in a linear manner, allowing better overall timing performance.

Detailed Solution

Referring once again to FIG. 3, a flow diagram of the ramping method is presented. In function block 300, values are assigned for a linear volume scaling zero to one-hundred percent. Then, in function block 310, the scale from zero to one-hundred is reversed so that zero becomes one-hundred, ninety-nine becomes one and so forth. Next, in function block 320, the scale is truncated at ninety-five. Thus, any value greater than ninety-five is set equal to the logarithmic value of zero in function block 330 and control passes to 370.

If the volume is less than or equal to ninety-five, then divide the volume value by six. One will recognize that other integer values can be substituted for six to tune the ramping process to particular audio perceptions. The remainder is used as an index into the table of masks 360 to select a mask value for the next step. For example:
a. Remainder=0 selects the mask X'7FFF'.
b. Remainder=1 selects the mask 7208.
c. and so on.

Finally, in function block 350 the mask is shifted by the result. This operation is implemented by loading the selected mask into a register. Using the result of the division by sixth root of two as the count of the number of times to shift right, and shifting the result. If the result of the division was zero, no shift is performed. The resulting value is used as the logarithmic volume.

Referring again to FIG. 1, the method described above is implemented as logic that is downloaded by the host computer via the I/O bus 10 to the shared memory 80. The logic is used by the DSP 90 to translate the current linear volume into the current logarithmic volume.

As discussed earlier in reference to FIG. 2, the host application passes successive audio samples 287 from its hard disk 290 to the audio subsystem with a desired linear volume and a desired ramp rate. The DSP 90 uses the logic it was initialized with to determine a linear change per unit of time and to create a current linear volume. Thereafter, the DSP 90 calculates the current logarithmic value and multiples the audio sample value to create the digital value used to drive the DAC. These steps are repeated until the volume is ramped in a smooth, accurate manner to the desired value.

While the invention has been described in terms of a preferred embodiment in a specific system environment, those skilled in the art recognize that the invention can be practiced, with modification, in other and different hardware and software environments within the spirit and scope of the appended claims.

Having thus described our invention, what we claim as new, and desire to secure by Letters Patent is:

1. An apparatus for controlling volume of a digital audio signal comprising:
digital signal processor means for translating a first linear volume value to a first logarithmically scaled volume value of the digital audio signal at a first time, the translating means comprising:
means for selecting a mask value from a table of calculated mask values according to a remainder from a division operation;
means for shifting the selected mask value according to an integer from the division operation;
a digital signal processor means for multiplying the first logarithmically scaled volume value to the digital audio signal at the first time; and
digital to analog converter means for converting the multiplied digital audio signal into an audio signal.

2. The apparatus as recited in claim 1 further comprising:
means for receiving a desired linear volume value and a desired ramp rate;
means for calculating a linear volume change per unit of time according to the first and desired linear volume values and the desired ramp rate; and,
means for updating a current linear volume after a unit of time has elapsed.

3. The apparatus as recited in claim 2 wherein the translating digital signal processor means translates the current linear volume value to a current logarithmically scaled volume value of the digital audio signal at a current time, the multiplying digital signal processor means multiplies the current logarithmically scaled volume value to the digital audio signal at the current time and the digital to analog converter means converts the multiplied digital audio signal at the current time into an audio signal.

4. The apparatus as recited in claim 2 wherein the desired linear volume and desired ramp rate are received from an application resident in a memory of a computer.

5. A method for controlling volume of a digital audio signal comprising the steps of:
translating a first linear volume value to a first logarithmically scaled volume value of the digital audio signal at a first time, the translating step comprising the steps of:
selecting a mask value from a table of calculated mask values according to a remainder from a division operation;
shifting the selected mask value according to an integer from the division operation;
multiplying the first logarithmically scaled volume value to the digital audio signal at the first time; and,
converting the multiplied digital audio signal into an audio signal.

6. The method as recited in claim 5 further comprising:
receiving a desired linear volume value and a desired ramp rate;
calculating a linear volume change per unit of time according to the first and desired linear volume values and the desired ramp rate; and,
updating a current linear volume after a unit of time has elapsed.

7. The method as recited in claim 6 wherein the current linear volume is translated to a current logarithmically scaled volume value of the digital audio signal at a current time, the current logarithmically scaled volume value is multiplied to the digital audio signal at the current time and the multiplied digital audio signal at the current time is converted into an audio signal.

8. The method as recited in claim 6 wherein the desired linear volume and desired ramp rate are received from an application resident in a memory of a computer.

9. A control element for directing the operation of a computer comprising storage for retaining signals recognizable by the computer for controlling the operation thereof, the signals comprising;
a digital audio signal comprising a sequence of digitized audio samples, each audio sample associated with one of a sequence of time intervals;
a first linear volume value associated with a first time interval within the sequence of time intervals;
a desired linear volume value associated with a second time interval within the sequence of time intervals;
a desired ramp rate to smoothly step a current linear volume value from the first linear volume value to the desired linear volume value, the current linear volume value associated with a current time interval; and, a current logarithmic volume value which is calculated by dividing the linear value, selecting a mask value form a table of calculated mask values according to a remainder from the division operation and shifting the selected mask value according to an integer form the division operation;

so that the audio sample associated with the current time interval is multiplied by the current logarithmic volume value and converted into an analog audio signal by a digital to analog converter.

* * * * *